United States Patent
Dunn

(10) Patent No.: US 12,046,419 B2
(45) Date of Patent: Jul. 23, 2024

(54) ELECTROMAGNETIC PICK AND PLACE INDUCTION HEATER

(71) Applicant: Raytheon Company, Waltham, MA (US)

(72) Inventor: Michael Dunn, Andover, MA (US)

(73) Assignee: Raytheon Technologies Corporation, Farmington, CT (US)

( * ) Notice: Subject to any disclaimer, the term of this patent is extended or adjusted under 35 U.S.C. 154(b) by 689 days.

(21) Appl. No.: 17/175,419

(22) Filed: Feb. 12, 2021

(65) Prior Publication Data

US 2022/0263434 A1    Aug. 18, 2022

(51) Int. Cl.
| | |
|---|---|
| H01F 7/20 | (2006.01) |
| H02N 15/00 | (2006.01) |
| H05B 6/06 | (2006.01) |
| H05B 6/14 | (2006.01) |
| H05B 6/36 | (2006.01) |

(52) U.S. Cl.
CPC ............ *H01F 7/206* (2013.01); *H02N 15/00* (2013.01); *H05B 6/06* (2013.01); *H05B 6/14* (2013.01); *H05B 6/36* (2013.01)

(58) Field of Classification Search
CPC .......... H02N 15/00; H01F 7/206; H05B 6/06; H05B 6/14; H05B 6/36; H05K 13/0409; H05K 13/0465
See application file for complete search history.

(56) References Cited

U.S. PATENT DOCUMENTS

| | | | |
|---|---|---|---|
| 5,816,482 A | 10/1998 | Grabbe | |
| 2001/0006185 A1* | 7/2001 | Cox | H05K 13/0486 257/E21.511 |
| 2007/0023422 A1* | 2/2007 | Obata | H05B 6/105 219/633 |
| 2010/0084164 A1* | 4/2010 | Fujiishi | H05K 3/303 174/250 |

(Continued)

FOREIGN PATENT DOCUMENTS

| | | | | |
|---|---|---|---|---|
| JP | 08236529 A | 9/1996 | | |
| JP | 6773331 B2 * | 10/2020 | ............... | B23K 1/00 |

(Continued)

OTHER PUBLICATIONS

International Preliminary Report on Patentability and Written Opinion with English translation of Box V, dated Aug. 15, 2023 for corresponding PCT Application No. PCT/US2022/016317.

*Primary Examiner* — Mohamad A Musleh
(74) *Attorney, Agent, or Firm* — Kinney & Lange, P.A.

(57) ABSTRACT

Apparatus and associated methods relate to a pick & place system that uses a magnetic core for both magnetic coupling with an assembly component and heating of the assembly component. The magnetic core has a component engagement surface configured to magnetically and thermally engage the component. A controller is configured to provide both AC current and DC current to an inductive coil wound about the magnetic core. DC current provided to the inductive coil induces a magnetic field within the magnetic core, thereby magnetically attracting the component when engaged with the component engagement surface. AC current provided to the magnetic core inductively heats the magnetic core, thereby heating the component when engaged with the component engagement surface.

10 Claims, 5 Drawing Sheets

(56) References Cited

U.S. PATENT DOCUMENTS

| | | | | |
|---|---|---|---|---|
| 2016/0372251 A1* | 12/2016 | Sturcken | ................. | H01F 27/38 |
| 2017/0148762 A1* | 5/2017 | Ayotte | ................... | B23K 1/018 |
| 2017/0312841 A1* | 11/2017 | Ayotte | ................... | B23K 1/002 |
| 2018/0161903 A1* | 6/2018 | Teraoka | ............. | H05K 13/0486 |
| 2022/0167536 A1* | 5/2022 | Dunn | ..................... | B23K 1/018 |

FOREIGN PATENT DOCUMENTS

| | | | | |
|---|---|---|---|---|
| WO | WO-9209397 A1 * | 6/1992 | ............. | H05B 6/103 |
| WO | WO-0130117 A1 * | 4/2001 | ............... | H05B 6/14 |

* cited by examiner

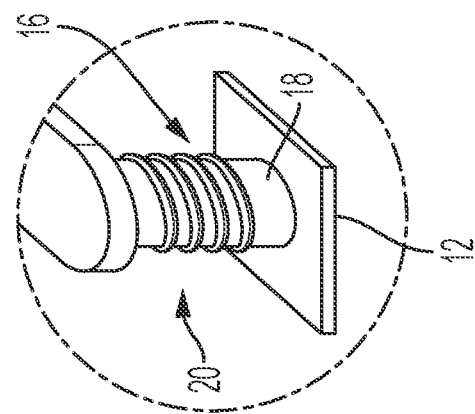
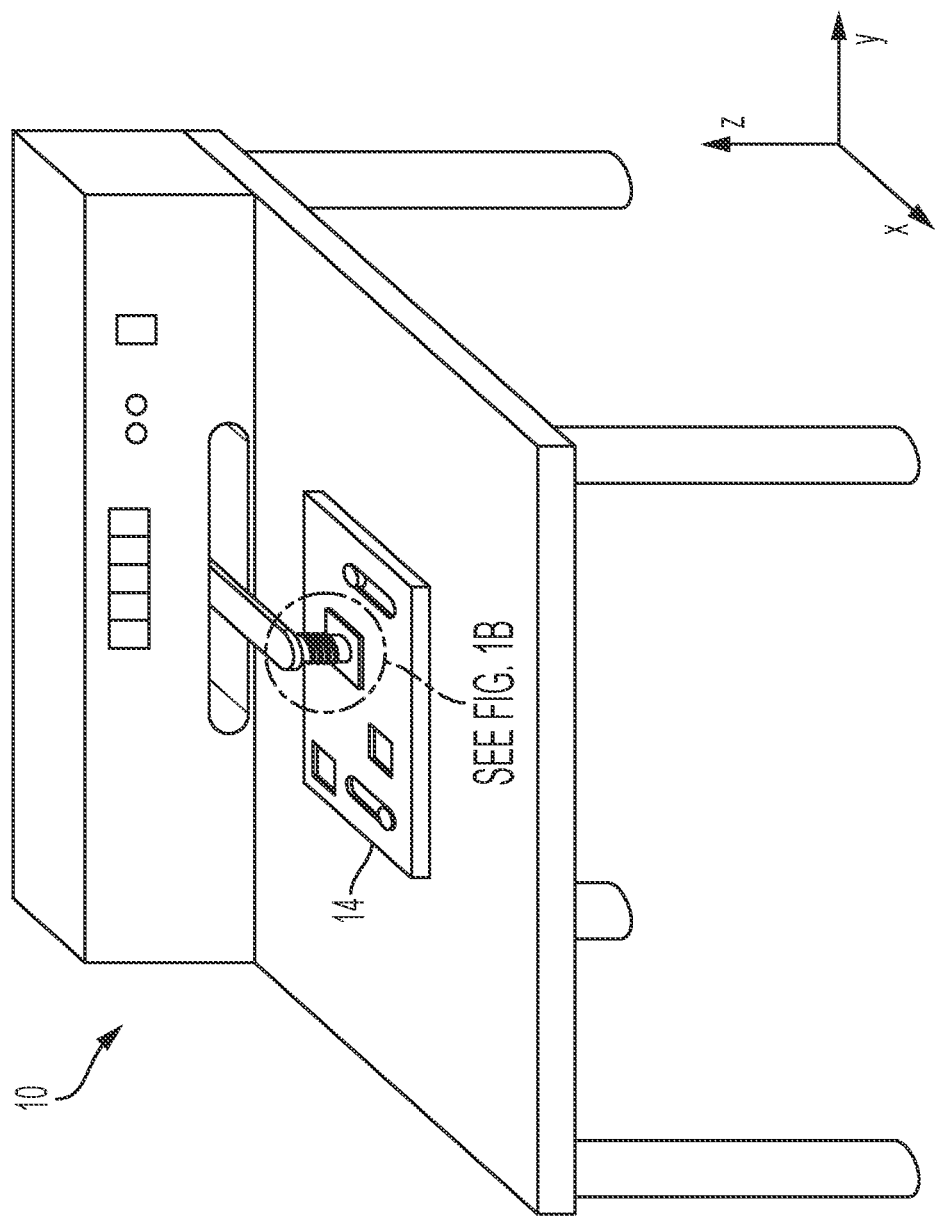
FIG. 1B
FIG. 1A

ELECTROMAGNETIC PICK AND PLACE INDUCTION HEATER

CROSS-REFERENCE TO RELATED APPLICATION(S)

This application is related to U.S. patent application Ser. No. 17/100,285, entitled "Systems and Methods for Removing an Adhesively-Attached Component from a Circuit Board Assembly" by Dunn, et al., filed Nov. 20, 2020, which is incorporated herein by reference in its entirety.

BACKGROUND

Pick & place tools are used to assemble, perform rework, and dissemble systems having components attached thereto. Pick & place tools can be configured to engage (e.g., "pick") a component, move that engaged component to a specific board location, and place the component at that specific location. Some pick & place tools are configured to also attach or detach components from locations to where they are to be assembled or from where they have already been assembled. The more capabilities that such pick & play tools have, the more expensive and complicated such systems seem to be.

SUMMARY

Apparatus and associated methods relate to a system for heating, picking, and placing a component of an assembly. The system includes a magnetic core, an indictive coil, and a controller. The magnetic core has a component engagement surface configured to magnetically and thermally engage the component of the assembly. The inductive coil is wound about the magnetic core. The controller provides a DC signal and an AC signal to the inductive coil. The DC signal induces a magnetic field within the magnetic core, thereby magnetically attracting the component when engaged with the component engagement surface. The AC signal inductively heats the magnetic core, thereby heating the component when engaged with the component engagement surface.

Some embodiments relate to a method for heating, picking, and placing a component of an assembly. The method includes engaging, at an engagement surface of a magnetic core, the component. The method includes inducing, via a DC signal provided to an inductive coil wound about the magnetic core, a magnetic field within the magnetic core, thereby magnetically attracting the component when engaged with the component engagement surface. The method also includes inductively heating, via an AC signal provided to the inductive coil wound about the magnetic core, the magnetic core, thereby heating the component when engaged with the component engagement surface.

BRIEF DESCRIPTION OF THE DRAWINGS

FIGS. 1A and 1B are perspective views of a pick & place tool removing an adhesively-attached component from a system assembly.

DETAILED DESCRIPTION

Figure 2:
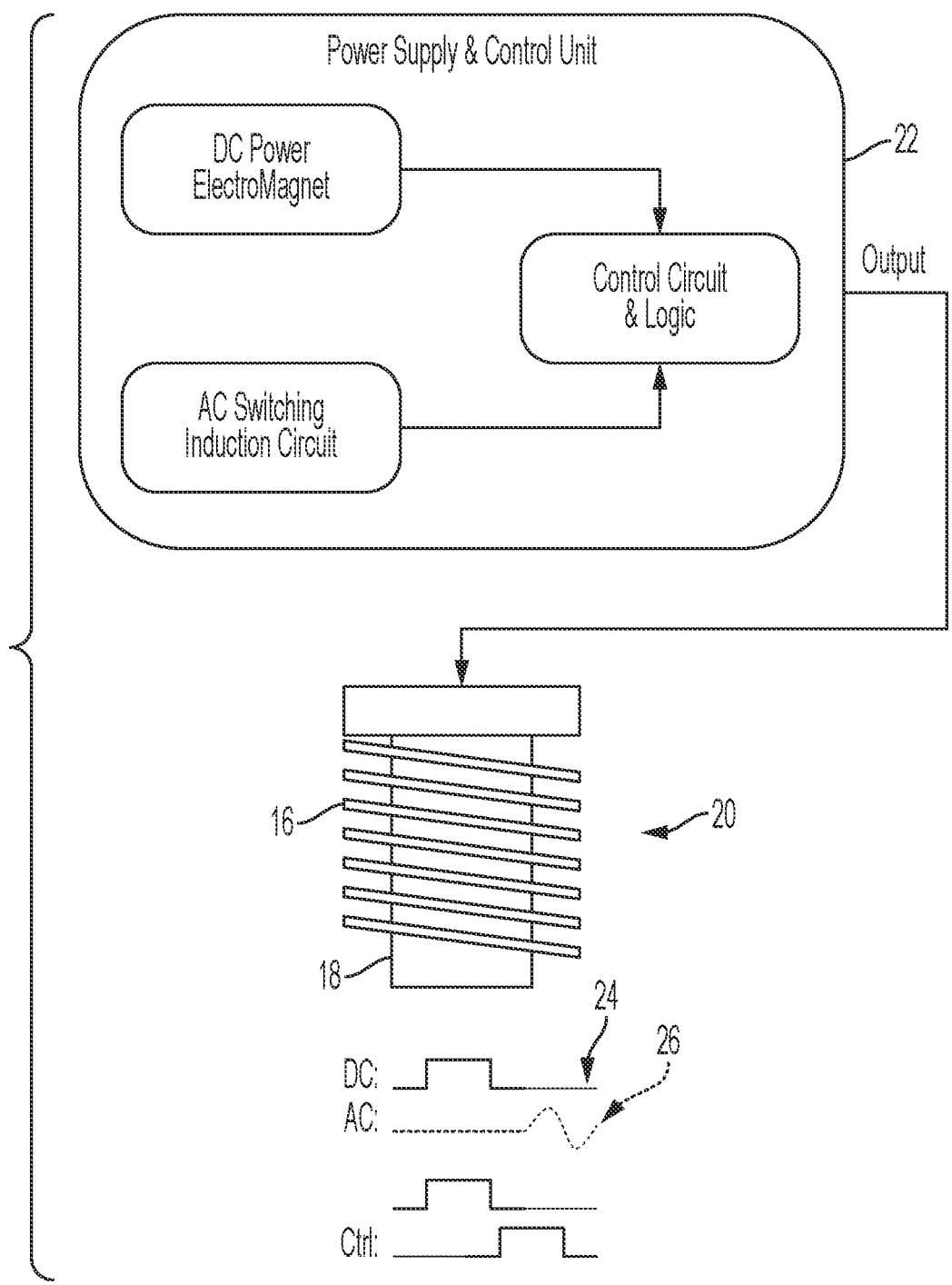
FIG. 2 is a schematic diagram of a component head configured to both inductively heat and magnetically attract a component of a system assembly.

Apparatus and associated methods relate to a pick & place system that uses a magnetic core for both magnetic coupling with an assembly component and heating of the assembly component. The magnetic core has a component engagement surface configured to magnetically and thermally engage the component. A controller is configured to provide both AC current and DC current to an inductive coil wound about the magnetic core. DC current provided to the inductive coil induces a magnetic field within the magnetic core, thereby magnetically attracting the component when engaged with the component engagement surface. AC current provided to the magnetic core inductively heats the magnetic core, thereby heating the component when engaged with the component engagement surface [Insert text]

FIGS. 1A and 1B are perspective views of a pick & place tool removing an adhesively-attached component from a system assembly. In FIGS. 1A and 1B, pick & place tool 10 is in the process of removing adhesively-attached component 12 from system assembly 14. Pick & place tool 10 is configured to both heat and magnetically attract adhesively-attached component. Such heating and magnetically attracting are coordinated so as to either attach a component to system assembly 10 of the remove the component, such as adhesively-attached component 12 from the system assembly 10. Such heating and magnetically attracting functions are both performed by providing an electrical current to inductive coil 16.

Magnetic attraction is performed by providing a DC current to inductive coil 16. Such a DC current conducted by inductive coil 16 induces a magnetic field which can be oriented to either attract or repel a magnetic object proximate one side of the inductive coil. Such a magnetic field can be directed by core 18 about which inductive coil 16 is wound. Heating is performed inductively by providing an AC current to inductive coil 16. Such an AC current can: i) inductively heat a conductive core, such as core 18 about which inductive coil 16 is wound; ii) inductively heat any conductive materials proximate thereto so as to be within an AC electromagnetic field induced by the AC current; and iii) conductively heat a component in contact with a conductive core, such as core 18, inductively heated by the AC current.

To remove adhesively-attached component 12 from system assembly 14, pick & place tool 10 moves component head 20, which includes inductive coil 16 and core 18, so as to align component head 20 with adhesively-attached component 12 in the x-y plane (e.g., a plane parallel to a level surface). Then, pick & place tool 10 then lowers (e.g., move in a negative z direction) component head 20 so as to engage component engagement surface 22 of core 18 with adhesively-attached component 12. Then, pick & place tool 10 can heat adhesively-attached component, by providing an AC current to inductive coil 16, so as to reduce an adhesion strength of adhesives that attach adhesively-attached component 12 to system assembly 14. When such adhesives are heated, the adhesion strength of adhesively-attached component 12 to system assembly 14 can be significant reduced so that removal of adhesively-attached component 12 from circuit board assembly 14 is possible.

Various types of adhesives can be used to attach adhesively-attached component 12 to circuit board assembly 14. Various solders, metals, and other adhesives are commonly used to attach electronic components to such circuit board assemblies, such as circuit board assembly 14. Such various adhesives can be used for conductive connection between leads of adhesively-attached component 12 and conduction traces of circuit board assembly 14. Some adhesives can be used for physical attachment only of adhesively-attached component 12 and circuit board assembly 14.

After the adhesive strength of the adhesives used to attach component 12 have been weakened, a DC current can be supplied to inductive coil 16, so as to magnetically attract component 12 to component head 20. After component 12 is magnetically coupled, pick & place tool 10 can raise (e.g., move in a positive z direction) component head 20 so as to lift component 12, which is magnetically coupled to component head 20. Then, pick & place tool 10 moves component head 20 so as to align component head 20 with parts removal bin. Finally, DC current is zeroed or inverted so as to drop component 12 into the aligned parts removal bin. Thus, AC and DC electrical current is sequenced so as to heat, magnetically couple, and remove component 12 from system assembly 14. In the depicted embodiment such a sequence of electrical excitation includes first providing an AC current, then a DC current, and then either no current or inverting the DC current. For the reverse operation—placing and attaching a component to system assembly, such a sequence of electrical excitation signals would be appropriately changed. Such sequencing of electrical excitation signals will be described in more detail below.

FIG. 2 is a schematic diagram of a component head configured to both inductively heat and magnetically attract a component of a system assembly. In FIG. 2, component head 20 includes inductive coil 16 wound about core 18. Electrical excitation signals are provided to inductive coil 16 by controller 22. Controller 22 sequences various electrical excitation signals in a manner that corresponds to specific operations performed by the pick & place tool. In the depicted embodiment, first DC excitation signal 24 is generated and provided to inductive coil 16. During the time that DC excitation signal 24 is provided to inductive coil 16, controller 24 is aligning an attached component to a location on the system assembly where such a component is to be attached. After DC excitation signal 24 is terminated, controller 22 generates AC excitation signal 26 to inductively heat adhesives that will attach the component to the system assembly. During the time that AC excitation signal 26 is provided, the controller can be providing downward force (e.g., force directed in a negative z direction) upon the component so as to ensure good thermal coupling between core 18 and the component.

Figure 3:
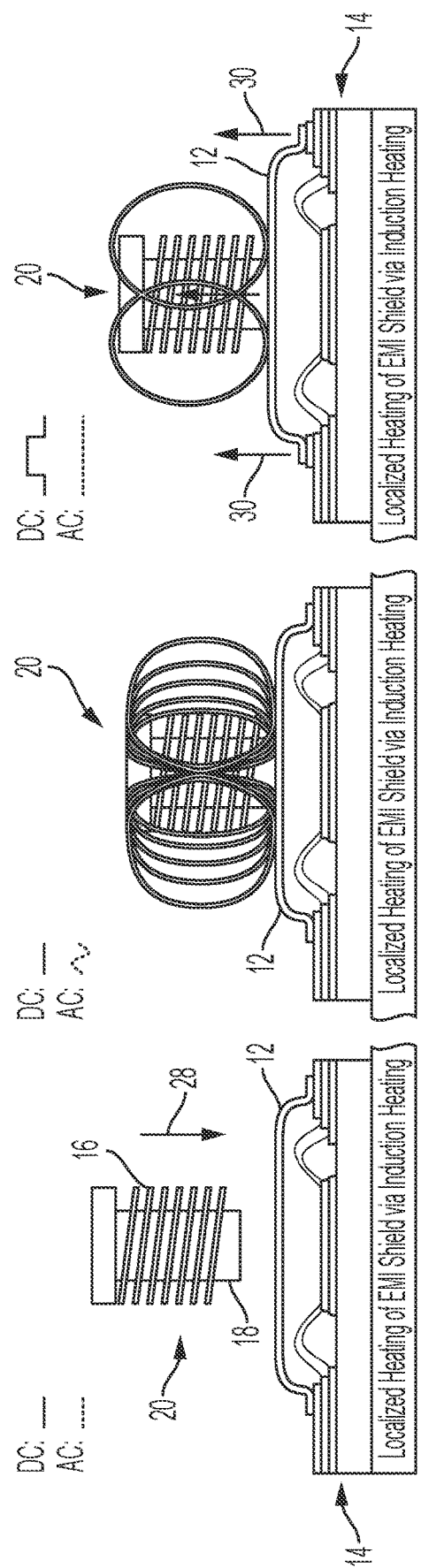
FIGS. 3A-3C are schematic diagrams illustrating placement and detachment of a component on a system assembly.

FIGS. 3A-3C are schematic diagrams illustrating placement and detachment of a component on a system assembly. In FIG. 3A, component head 20 is aligned (e.g., in the x-y plane) with component 12, which is adhesively attached to system assembly 14. In the depicted embodiment component 12 is a cover for an electronic component attached to system assembly 14. Component head can be used to pick & place any type of component to which component head 20 can couple. In some embodiments, as will be shown below, coupling can be augmented using a vacuum to provide additional or complimentary coupling between component head 20 and component 12. In FIG. 3A, arrow 28 indicates that component head is being lowered so as to engage (e.g., contact), component 12.

In FIG. 3B, AC excitation signal 26 is provided to inductive coil 14 so as to heat component 12. Such heating can be performed for a predetermine time duration or an be performed until component 12 or core 18 reaches a predetermined temperature. In some embodiments, a component head 20 includes a temperature sensor configured to sense temperature of core 20 and/or of component 12. After (or while) component 12 has been heated, DC excitation signal 24 is provided to inductive coil 14 so as to magnetically attract component 12 to component head 20. In FIG. 3c, arrows 30 indicate that component head is being raised so as to remove component 12, which is magnetically coupled to component head 20, from system assembly 14.

Figure 4:
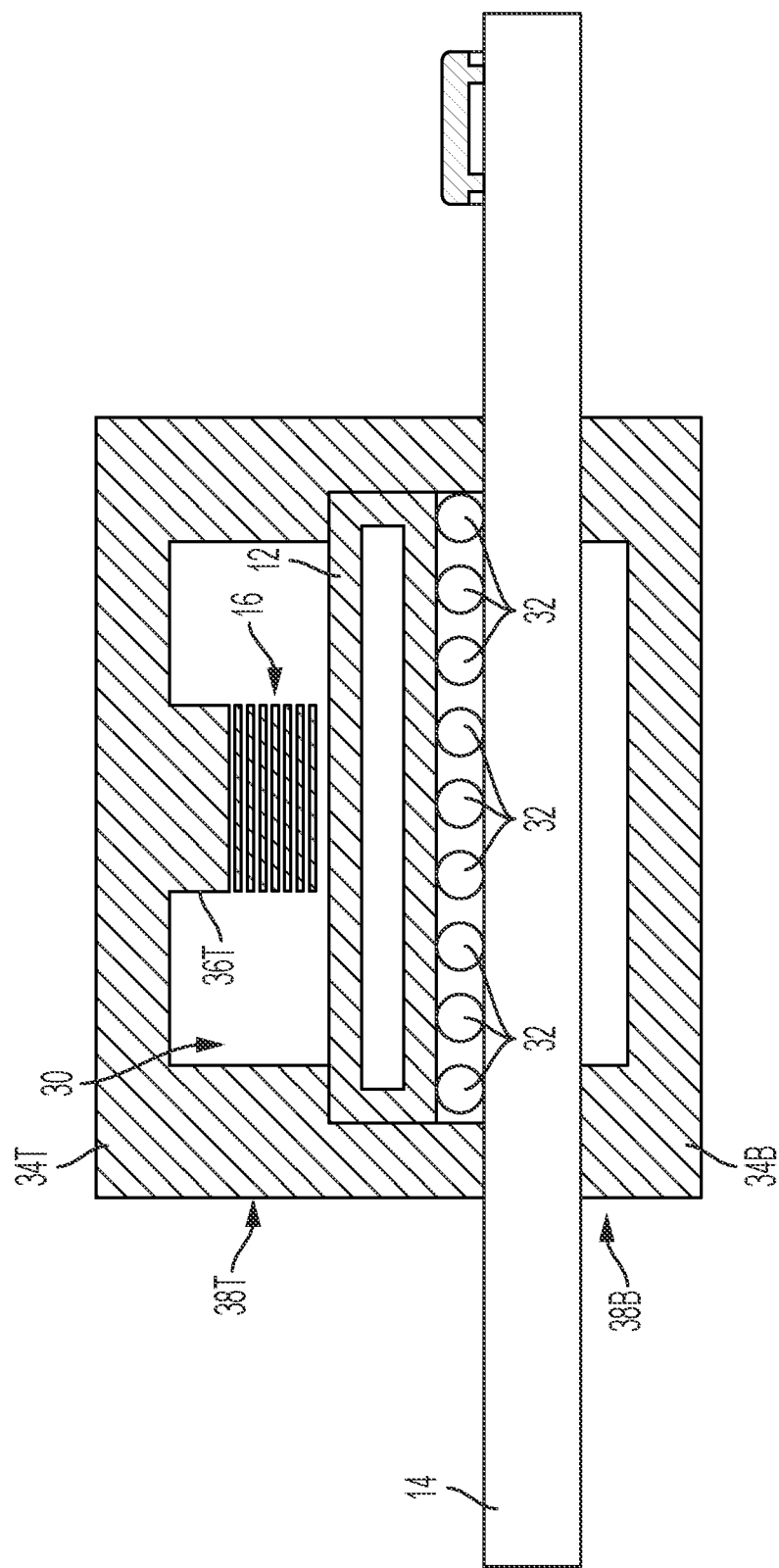
FIG. 4 is a side-elevation view of an embodiment of a pick & place tool configured to inductively heat and adhesively-attach/detach a component.

FIG. 4 is a side-elevation view of an embodiment of a pick & place tool configured to inductively heat and adhesively-attach/detach a component. In FIG. 4, adhesively-attached component 12, is shown attached to system assembly 14 via solder balls 32. Component head 20 includes inductive coil 16, and complementary high-permeability members 34T and 34B. Complementary pair of high-permeability members 34T and 34B can be positioned on opposite sides of system assembly 14 about adhesively-attached component 12. At least one of complementary pair the of high-permeability members 34T and 34B includes central pedestal 36T (which operates as core 18 operates in the embodiments depicted in FIGS. 1-3C and). In the depicted embodiment, top high-permeability member 34T includes central pedestal 36T. "Top" here refers to the one of complementary high-permeability members 34T and 34B that is situated on the same side of system assembly 14 as the side that adhesively-attached component 12 is situated. The term "bottom" is used to refer to the other one of complementary high-permeability members 34T and 34B that is situated on the opposite side of system assembly 14 as the side that adhesively-attached component 12 is situated. The terms "top" and "bottom" need not be indicative of a particular orientation of circuit board assembly 14. Instead, the terms "first" and "second" can be used to distinguish between complementary high-permeability members 34T and 34B A magnetic field can be induced in complementary high-permeability members 34T and 34B via inductive coil 16 circumscribing central pedestal 24T of the complementary pair of high-permeability members 34T and 34B. Coil driver 18 is configured to generate an AC current in inductive coil 16 circumscribing central pedestal 36T, thereby inducing the magnetic field therein. Because high-permeability members 34T and 34B are made of high-permeability materials, any magnetic fields induced therein are channel via the high-permeability members so as to minimize losses to the magnetic field induced. The magnetic field takes the path of "least resistance," which is a metaphor for the closed path of highest permeability. By directing the magnetic field, via complementary high-permeability members 34T and 34B, complementary high-permeability members 34T and 34B shield from magnetic field exposure circuitry outside an interior cavity defined by interior surfaces of high-permeability members 34T and 34B. Only the circuitry within such a cavity will be exposed to the magnetic field.

At least one of complementary pair the of high-permeability members 34T and 34B has a peripheral pedestal. In the depicted embodiment both top and bottom high-permeability members 34T and 34B have central pedestals—central pedestals 36T and 36B, respectively. Central pedestal 36T is configured to direct a magnetic field induced therein through the adhesively-attached component. Peripheral pedestals 38T and 38B are configured to provide a return path for the magnetic field about a periphery of the adhesively-attached component. Inductive coil is wound about central pedestal 36T. Thus configured, central pedestal 36T functions as core 18 functions in the embodiments depicted in FIGS. 1-3C.

In operation, complementary high-permeability members 34T and 34B are positioned on opposite sides of the circuit board assembly about the adhesively-attached component 12. High-permeability members 34T and 34B are positioned in clam-shell fashion so as to substantially enclose adhesively-attached component 12 within the interior cavity defined by interior surfaces of high-permeability members 34T and 34B. A magnetic field is then induced within high-permeability members 34T and 34B via AC excitation of inductive coil 16 by coil driver 18. The magnetic field induced is directed through adhesively-attached component 12 so as to induce AC currents with any conductive material within or below adhesively-attached component 12, thereby heating such conductive materials. Any solders, leads, circuit board traces, etc., which are located in this region where the magnetic field is directed will then heat due to these induced AC currents. Such heating can either directly heat the adhesives (e.g., if solder adhesives are located in this region) or indirectly heat the adhesives (e.g., via thermal conduction from the heated conductive materials to the adhesives).

One the adhesives have been heated, adhesively-attached component 12 can be removed from circuit board assembly 14. Various methods of removing adhesively-attached component 12 from circuit board assembly 14 can be employed. For example, top high-permeability member 34T can be raised, and adhesively-attached component 12 can be manually removed using a tool, tweezers, etc. In some embodiments, top high-permeability member 34T can be equipped with a suction system to as to vacuum attach top high-permeability member 34T to a top surface of adhesively-attached component 12. Then, by raising top high-permeability member 34T, vacuum attached component 12 will be removed thereby.

Figure 5:
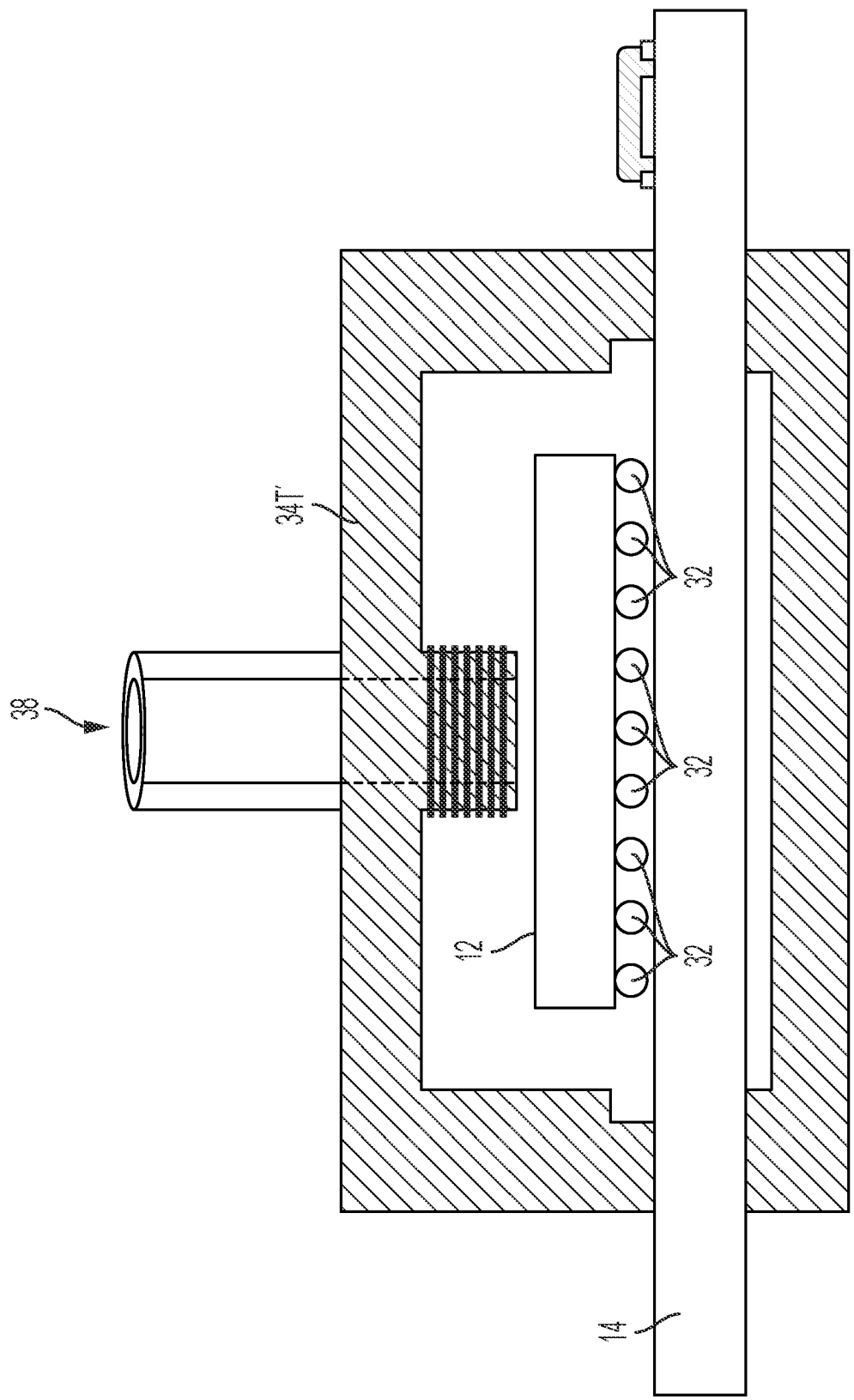
FIG. 5 is a side-elevation view of an embodiment of a component removal tool that includes a part extractor using vacuum technology.

FIG. 5 is a side-elevation view of an embodiment of a component removal tool that includes a part extractor using vacuum technology. In FIG. 5, adhesively attached component 12, is shown attached to system assembly 14 via solder balls 32. Top high-permeability member 34T' differs from top high-permeability member 34T shown in the embodiment depicted in FIG. 4. Top high-permeability member 34T' includes part suction port 38. Part suction port 38 is a central aperture from an outside surface of top high-permeability member 34T' through central pedestal 34T'. A vacuum system can be fluidly connected to part suction port 38 so as to provide a suction that can cause central pedestal 34T' to engage adhesively-attached component 12. Then, when solder balls 32 have melted (e.g., during reflow of the solder balls), top high-permeability member 34T' can be removed, thereby removing component 12, whose melted solder balls 32 no longer provide adhesive attachment between component 12 and system assembly 14. Part suction port 38 can be located in various other configurations, such as, for example, adjacent to central pedestal 34T'. In some embodiments, for example, an annular aperture can circumscribe central pedestal 34T' so as to provide an annular suction seal with adhesively-attached component 12.

Discussion of Possible Embodiments

The following are non-exclusive descriptions of possible embodiments of the present invention.

Apparatus and associated methods relate to a system for heating, picking, and placing a component of an assembly. The system includes a magnetic core, an indictive coil, and a controller. The magnetic core has a component engagement surface configured to magnetically and thermally engage the component of the assembly. The inductive coil is wound about the magnetic core. The controller provides a DC signal and an AC signal to the inductive coil. The DC signal induces a magnetic field within the magnetic core, thereby magnetically attracting the component when engaged with the component engagement surface. The AC signal inductively heats the magnetic core, thereby heating the component when engaged with the component engagement surface.

The system of the preceding paragraph can optionally include, additionally and/or alternatively, any one or more of the following features, configurations and/or additional components:

A further embodiment of the foregoing system can further include a mechanically actuator that moves the magnetic core and inductor wound therearound.

A further embodiment of any of the foregoing systems, wherein the mechanical actuator can include an x-y position actuator and a z position actuator. The x-y position actuator is configured to align the magnetic core and inductor wound therearound with the component in an x-y plane. The z position actuator is configured to engage/disengage the magnetic core with the component in a z direction.

A further embodiment of any of the foregoing systems, wherein the controller can be further configured to sequence the DC signal and the AC signal provided, so as either to first heat the component and then magnetically attract the component or to first magnetically attract the component and then to heat the component.

A further embodiment of any of the foregoing systems, wherein when removing the component from the assembly, the controller first can provide the AC signal, thereby heating the component, and then can provide the DC signal, thereby magnetically attracting the component.

A further embodiment of any of the foregoing systems, wherein when installing the component to the assembly, the controller first can provide the DC signal, thereby magnetically attracting the component, and then can provide the AC signal, thereby heating the component.

A further embodiment of any of the foregoing systems, wherein the controller can be configured to simultaneously provide both the DC signal and the AC signal, so as to simultaneously heat and magnetically attract the component.

A further embodiment of any of the foregoing systems, wherein the magnetic core can have a vacuum aperture along a length of the magnetic core between the component engagement surface and another surface. The system can further include a vacuum component extractor configured to provide vacuum within the vacuum aperture, thereby providing vacuum coupling of the component when engaged with the component engagement surface.

A further embodiment of any of the foregoing systems, wherein the controller can be configured to sequence the AC signal provided to the inductive coil and the vacuum provided within the vacuum aperture, so as either to first heat the component and then provide vacuum coupling to the component or to first provide vacuum coupling to the component and then to heat the component.

A further embodiment of any of the foregoing systems, wherein the controller can be configured to simultaneously provide both the AC signal to the inductive coil and the vacuum within the vacuum aperture, so as to simultaneously heat the component and provide vacuum coupling to the component.

A further embodiment of any of the foregoing systems, wherein the magnetic core can further include a central pedestal and a peripheral pedestal. The central pedestal is configured to direct a magnetic field induced therein through the component of the assembly. The peripheral pedestal is configured to provide a return path for the magnetic field about a periphery of the component of the assembly.

Some embodiments relate to a method for heating, picking, and placing a component of an assembly. The method includes engaging, at an engagement surface of a magnetic core, the component. The method includes inducing, via a DC signal provided to an inductive coil wound about the magnetic core, a magnetic field within the magnetic core, thereby magnetically attracting the component when engaged with the component engagement surface. The method also includes inductively heating, via an AC signal provided to the inductive coil wound about the magnetic core, the magnetic core, thereby heating the component when engaged with the component engagement surface.

The method of the preceding paragraph can optionally include, additionally and/or alternatively, any one or more of the following features, configurations and/or additional components:

A further embodiment of the foregoing method can further include aligning, via an x-y position actuator, the magnetic core and inductor wound therearound with the component in an x-y plane.

A further embodiment of any of the foregoing methods, wherein the mechanical actuator can include engaging and/or disengaging, via a z position actuator, the magnetic core with the component in a z direction.

A further embodiment of any of the foregoing methods can further include sequencing the DC signal and the AC signal provided, so as either to first heat the component and then magnetically attract the component or to first magnetically attract the component and then to heat the component.

A further embodiment of any of the foregoing methods can further include removing the component from the assembly by: first providing, via the controller, the AC signal, thereby heating the component; and then providing, via the controller, the DC signal, thereby magnetically attracting the component.

A further embodiment of any of the foregoing methods can further include installing the component to the assembly by: first providing, via the controller, the DC signal, thereby magnetically attracting the component; and then providing, via the controller, the AC signal, thereby heating the component.

A further embodiment of any of the foregoing methods can further include simultaneously providing both the DC signal and the AC signal, so as to simultaneously heat and magnetically attract the component.

A further embodiment of any of the foregoing methods, wherein the magnetic core can have a vacuum aperture along a length of the magnetic core between the component engagement surface and another surface. The method can further include providing, via a vacuum component extractor, vacuum within the vacuum aperture, thereby providing vacuum coupling of the component when engaged with the component engagement surface.

A further embodiment of any of the foregoing methods can further include sequencing the AC signal provided to the inductive coil and the vacuum provided within the vacuum aperture, so as either to first heat the component and then provide vacuum coupling to the component or to first provide vacuum coupling to the component and then to heat the component.

While the invention has been described with reference to an exemplary embodiment(s), it will be understood by those skilled in the art that various changes may be made and equivalents may be substituted for components thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for heating, picking, and placing a component of an assembly, the system comprising:
    a magnetic core having a component engagement surface configured to magnetically and thermally engage the component of the assembly;
    an inductive coil wound about the magnetic core; and
    a controller that provides a DC signal and an AC signal to the inductive coil, the DC signal inducing a magnetic field within the magnetic core, thereby magnetically attracting the component when engaged with the component engagement surface, the AC signal inductively heating the magnetic core, thereby heating the component when engaged with the component engagement surface,
    wherein the controller is further configured to sequence the DC signal and the AC signal provided, so as either to first heat the component and then magnetically attract the component or to first magnetically attract the component and then to heat the component.

2. The system of claim 1, further comprising:
    a mechanically actuator that moves the magnetic core and inductor wound therearound.

3. The system of claim 2, wherein the mechanical actuator includes:
    an x-y position actuator configured to align the magnetic core and inductor wound therearound with the component in an x-y plane; and
    a z position actuator configured to engage/disengage the magnetic core with the component in a z direction.

4. The system of claim 1, wherein when removing the component from the assembly, the controller first provides the AC signal, thereby heating the component, and then provides the DC signal, thereby magnetically attracting the component.

5. The system of claim 1, wherein when installing the component to the assembly, the controller first provides the DC signal, thereby magnetically attracting the component, and then provides the AC signal, thereby heating the component.

6. The system of claim 1, wherein the controller is configured to simultaneously provide both the DC signal and the AC signal, so as to simultaneously heat and magnetically attract the component.

7. The system of claim 1, wherein the magnetic core has a vacuum aperture along a length of the magnetic core between the component engagement surface and another surface, the system further comprising:
    a vacuum component extractor configured to provide vacuum within the vacuum aperture, thereby providing vacuum coupling of the component when engaged with the component engagement surface.

8. The system of claim 7, wherein the controller is configured to sequence the AC signal provided to the inductive coil and the vacuum provided within the vacuum aperture, so as either to first heat the component and then provide vacuum coupling to the component or to first provide vacuum coupling to the component and then to heat the component.

9. The system of claim 7, wherein the controller is configured to simultaneously provide both the AC signal to the inductive coil and the vacuum within the vacuum aperture, so as to simultaneously heat the component and provide vacuum coupling to the component.

10. The system of claim 1, wherein the magnetic core further includes:
- a central pedestal configured to direct a magnetic field induced therein through the component of the assembly; and
- a peripheral pedestal configured to provide a return path for the magnetic field about a periphery of the component of the assembly.

* * * * *